US012360463B2

(12) United States Patent
Maleev (10) Patent No.: US 12,360,463 B2
(45) Date of Patent: Jul. 15, 2025

(54) FIBER BUNDLE BASED OPTICAL SPOT SIZE SELECTOR

(71) Applicant: Tokyo Electron Limited, Tokyo (JP)

(72) Inventor: Ivan Maleev, Fremont, CA (US)

(73) Assignee: Tokyo Electron Limited, Tokyo (JP)

( * ) Notice: Subject to any disclaimer, the term of this patent is extended or adjusted under 35 U.S.C. 154(b) by 24 days.

(21) Appl. No.: 18/474,670

(22) Filed: Sep. 26, 2023

(65) Prior Publication Data

US 2025/0102924 A1    Mar. 27, 2025

(51) Int. Cl.
*G03F 7/00* (2006.01)
(52) U.S. Cl.
CPC .... *G03F 7/706849* (2023.05); *G03F 7/70625* (2013.01); *G03F 7/706851* (2023.05)
(58) Field of Classification Search
CPC .......... G03F 7/706849; G03F 7/70625; G03F 7/706851
See application file for complete search history.

(56) References Cited

U.S. PATENT DOCUMENTS

| 6,198,531 | B1 | 3/2001 | Myrick et al. |
| 2002/0139925 | A1 | 10/2002 | Mitrovic |
| 2005/0141810 | A1* | 6/2005 | Vaez-Iravani .......... G02B 27/48 385/33 |
| 2019/0072482 | A1 | 3/2019 | Feng et al. |
| 2019/0331592 | A1* | 10/2019 | Dighe ................ G01B 11/0616 |
| 2021/0364279 | A1 | 11/2021 | Manassen et al. |
| 2023/0251190 | A1* | 8/2023 | Prater .................. A61B 5/0086 250/339.08 |

FOREIGN PATENT DOCUMENTS

CN    114964015 A    8/2022

OTHER PUBLICATIONS

International Search Report and Written Opinion issued Oct. 28, 2024, in PCT/US2024/038325 (with English Translation), 10 pages.

* cited by examiner

*Primary Examiner* — Tarifur R Chowdhury
*Assistant Examiner* — Kaitlyn E Kidwell
(74) *Attorney, Agent, or Firm* — Oblon, McClelland, Maier & Neustadt, L.L.P.

(57) ABSTRACT

An optical apparatus is provided. The optical apparatus includes a plurality of optical fibers each configured to transmit a respective light beam. The plurality of optical fibers includes at least one first optical fiber and at least one second optical fiber. The optical apparatus also includes a first shutter module coupled to the first optical fiber and configured to adjust a first light beam in the first optical fiber in at least one aspect selected from the group consisting of light intensity, light polarization and spectral distribution when the first shutter module is closed. The second optical fiber is independent of the first shutter module. The plurality of optical fibers is bundled at one end to output a combined light beam so that a profile of the combined light beam is controlled by opening or closing the first shutter module.

21 Claims, 6 Drawing Sheets

FIBER BUNDLE BASED OPTICAL SPOT SIZE SELECTOR

FIELD OF THE INVENTION

This disclosure relates to an optical apparatus and optical metrology.

BACKGROUND

Optical metrology is the science and technology of making measurements with the use of light as standards or information carriers. These measurements may focus on the properties of light itself or other properties such as distance. In recent years, optical metrology has become increasingly important in fundamental research (e.g. biomedical and life sciences) as well as engineering applications (e.g. aerospace and defense) due to its high resolution, easy and quick operation, non-destructiveness, etc. Particularly in the manufacturing industry, various optical metrology tools are being developed and used for quality control and non-destructive testing.

SUMMARY

The present disclosure relates to an optical apparatus and a method of operating the same.

According to a first aspect of the disclosure, an optical apparatus is provided. The optical apparatus includes a plurality of optical fibers each configured to transmit a respective light beam. The plurality of optical fibers includes at least one first optical fiber and at least one second optical fiber. The optical apparatus also includes a first shutter module coupled to the first optical fiber and configured to adjust a first light beam in the first optical fiber in at least one aspect selected from the group consisting of light intensity, light polarization and spectral distribution when the first shutter module is closed. The second optical fiber is independent of the first shutter module. The plurality of optical fibers is bundled at one end to output a combined light beam so that a profile of the combined light beam is controlled by opening or closing the first shutter module.

In some embodiments, the first shutter module is configured to let the first light beam pass through the first optical fiber when the first shutter module is open and block the first light beam when the first shutter module is closed.

In some embodiments, the plurality of optical fibers is bundled at the one end to output the combined light beam so that a size or shape of the combined light beam is controlled by opening or closing the first shutter module.

In some embodiments, the optical apparatus further includes a second shutter module coupled to the first optical fiber and configured to adjust the first light beam in at least one aspect selected from the group consisting of light polarization and spectral distribution when the second shutter module is closed.

In some embodiments, the first shutter module includes a spectral filter that is configured to filter a spectral portion of the first light beam when the first shutter module is closed.

In some embodiments, the spectral filter is an ultraviolet (UV) filter configured to block UV wavelengths of the first light beam when the first shutter module is closed.

In some embodiments, the first shutter module includes a polarization modulator that is configured to modulate polarization of the first light beam when the first shutter module is closed.

In some embodiments, the first shutter module includes at least one shutter selected from the group consisting of a mechanical light-blocking device, a digital micromirror device, an intensity modulator, a polarization modulator and a spectral filter device.

In some embodiments, the intensity modulator is liquid-crystal-display (LCD)-based. The polarization modulator is LCD-based. The spectral filter device includes a dichroic mirror or a Fabry-Perot filter that is mechanically moving or scanning spectral filter.

In some embodiments, the optical apparatus further includes a second shutter module coupled to the second optical fiber and configured to adjust a second light beam in the second optical fiber in at least one aspect selected from the group consisting of light intensity, light polarization and spectral distribution when the second shutter module is closed. The first optical fiber is independent of the second shutter module.

In some embodiments, the optical apparatus further includes optics configured to receive the combined light beam from the plurality of optical fibers.

In some embodiments, the optical apparatus further includes a sample holder configured to receive a wafer sample which receives the combined light beam from the optics. The optical apparatus further includes a detector configured to detect output light from the sample holder.

In some embodiments, the optical apparatus further includes at least one light source configured to emit light for the plurality of optical fibers.

In some embodiments, the plurality of optical fibers is bundled at another end to receive light from a common light source.

In some embodiments, the plurality of optical fibers is each independently coupled to a respective shutter module.

In some embodiments, the plurality of optical fibers includes six first optical fibers and a single second optical fiber. The first shutter module is coupled to the six first optical fibers and configured to let six respective first light beams pass through the six first optical fibers when the first shutter module is open and block the six respective first light beams when the first shutter module is closed. The single second optical fiber is coupled to no shutter module.

According to a second aspect of the disclosure, a method is provided. The method includes directing light through an optical apparatus that includes a plurality of optical fibers each configured to transmit a respective light beam. The plurality of optical fibers includes at least one first optical fiber and at least one second optical fiber. The optical apparatus also includes a first shutter module coupled to the first optical fiber and configured to adjust a first light beam in the first optical fiber in at least one aspect selected from the group consisting of light intensity, light polarization and spectral distribution when the first shutter module is closed. The second optical fiber is independent of the first shutter module. The plurality of optical fibers is bundled at one end to output a combined light beam so that a profile of the combined light beam is controlled by opening or closing the first shutter module. The method also includes adjusting the profile of the combined light beam by opening or closing the first shutter module.

In some embodiments, the first shutter module is configured to let the first light beam pass through the first optical fiber when the first shutter module is open and block the first light beam when the first shutter module is closed. The plurality of optical fibers is bundled at the one end to output the combined light beam so that a size or shape of the combined light beam is controlled by opening or closing the first shutter module. The method further includes adjusting the size or shape of the combined light beam by opening or closing the first shutter module.

In some embodiments, the method further includes directing the combined light beam output by the optical apparatus through optics to a wafer sample on a sample holder. Output light from the sample holder is detected with a detector. The profile of the combined light beam is adjusted by opening or closing the first shutter module.

In some embodiments, the method further includes sequentially measuring neighboring locations of the wafer sample by sequentially and selectively closing a plurality of shutters each independently coupled to a respective optical fiber of the plurality of optical fibers.

Note that this summary section does not specify every embodiment and/or incrementally novel aspect of the present disclosure or claimed invention. Instead, this summary only provides a preliminary discussion of different embodiments and corresponding points of novelty. For additional details and/or possible perspectives of the invention and embodiments, the reader is directed to the Detailed Description section and corresponding figures of the present disclosure as further discussed below.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "top," "bottom," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The order of discussion of the different steps as described herein has been presented for clarity's sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

In the drawings, like reference numerals designate identical or corresponding parts throughout the several views. Additionally, as used herein, the words "a", "an" and the like generally carry a meaning of "one or more", unless stated otherwise.

Furthermore, the terms, "approximately", "approximate", "about" and similar terms generally refer to ranges that include the identified value within a margin of 20%, 10%, or preferably 5%, and any values therebetween.

Optical metrology and inspection tools often benefit from the capability to select a desired spot size on a sample. For example, an application with a limited sample target size may require a smaller spot, whereas another application with e.g. significant sample non-uniformity may benefit from a larger spot to average out sample non-uniformities, and to increase light-gathering capability or average the same illumination power over a larger area to reduce the effects of thermal damage and photo contamination.

Traditional methods to control the optical spot size may utilize multiple optical objectives which are mechanically swapped to generate a smaller or larger optical spot on a sample, depending on the specific application. An alternative could be a single objective of variable magnification; however that capability comes at a cost not only monetarily, but also in complexity and in performance.

Techniques herein include a method where an optical spot size on a sample is controlled using a plurality of fibers (e.g. a fiber bundle) and intensity, spectral, or polarization modulation of light passing through individual fibers in the fiber bundle. For example, the light through different fibers or groups of fibers in a fiber bundle can be turned on and off using individual shutters. The fiber bundle output is then imaged on a sample with optics known to one skilled in the art. Not accounting for diffraction broadening, the size of the optical spot on a sample is then equal to the size of illuminated portion of the bundle, divided by system magnification M.

According to some aspects of the present disclosure, a shutter subsystem may only allow light into a single fiber in a fiber bundle, and then only that single fiber generates an illumination spot on a sample. Therefore, the size of the optical spot on the sample is equal to the size of the fiber divided by system magnification M. According to other aspects of the present disclosure, when a shutter subsystem can allow light into all fibers in a bundle, the illumination spot size on a sample is equal to the size of the whole bundle divided by M. For example, a large spot area can be equal to the small spot area times the number of fibers in the fiber bundle.

Figure 1:
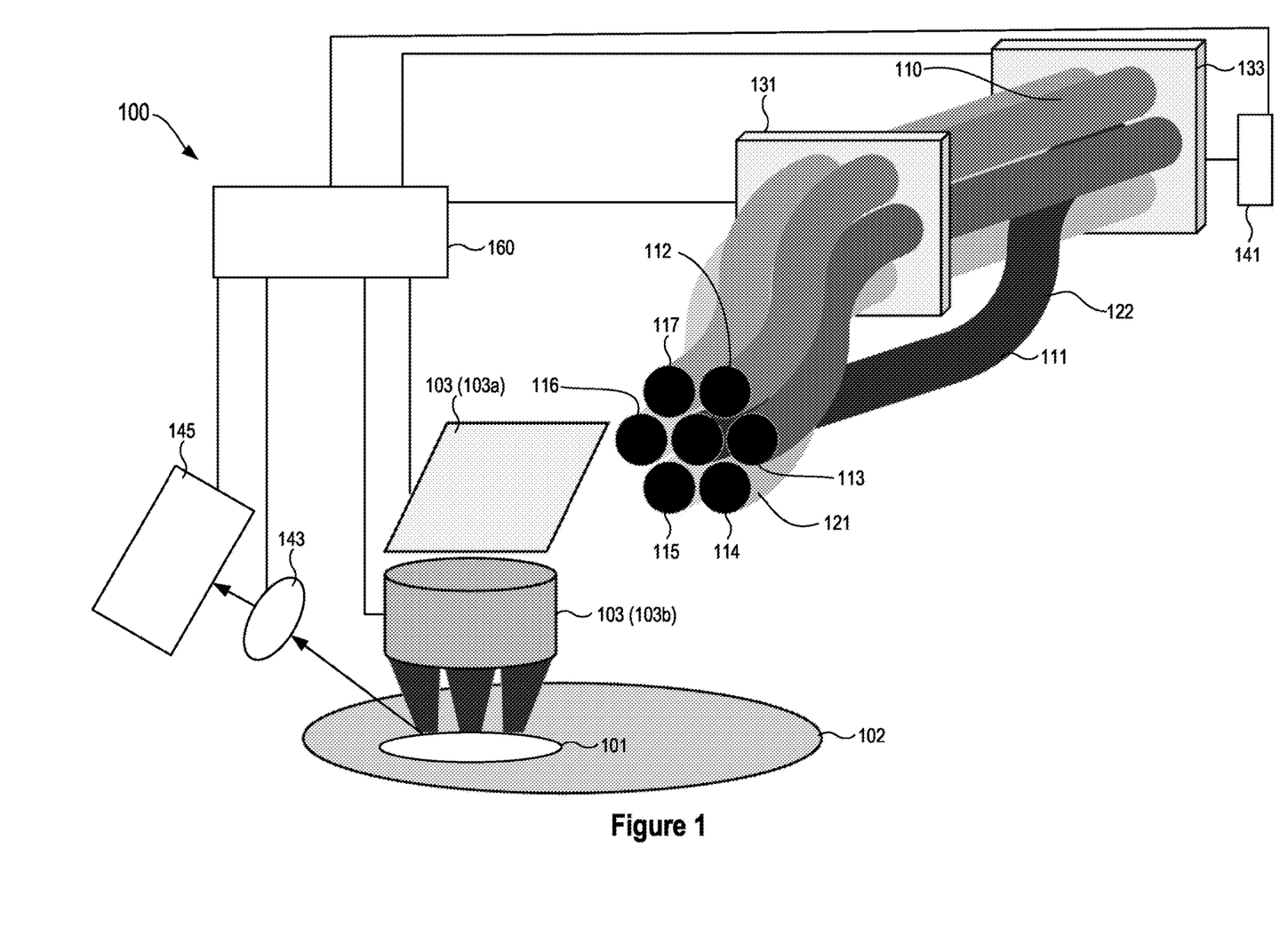
FIG. 1 shows a schematic view of an optical apparatus in accordance with one embodiment of the present disclosure.

FIG. 1 shows a schematic view of an optical apparatus 100 in accordance with one embodiment of the present disclosure. As illustrated, the optical apparatus 100 includes a plurality of optical fibers 110 each configured to transmit a respective light beam. The optical apparatus 100 can also include a first shutter module 131 coupled to one or more of the plurality of optical fibers 110 to modulate the respective light beam(s) in at least one aspect selected from the group consisting of light intensity, light polarization and spectral distribution when the first shutter module 131 is closed.

In a non-limiting example, the optical apparatus 100 includes seven optical fibers 111, 112, 113, 114, 115, 116 and 117. The first shutter module 131 is coupled to the optical fibers 111, 112, 113, 114, 115 and 116 while the optical fiber 117 is independent of the first shutter module 131. Therefore, the optical fibers 111, 112, 113, 114, 115 and 116 will also be referred to as first optical fibers 121 (or a first fiber group). The optical fiber 117 will also be referred to as a second optical fiber 122 (or a second fiber group).

Herein, the first shutter module 131 can include one or more shutters in the form of a mechanical light-blocking device that is coupled to the first fiber group and configured to adjust first light beams in the first optical fibers 121. When the mechanical light-blocking device is open, the first shutter module 131 is configured to let the first light beams pass through the first optical fibers 121. When the mechanical light-blocking device is closed, the first shutter module 131 is configured to completely block the first light beams. As a result, the first optical fibers 121 will output no light.

The plurality of optical fibers 110 can be bundled at one end to output a combined light beam so that a size or shape of the combined light beam is controlled by opening or closing the first shutter module 131. That is, when the first shutter module 131 is open, light beams can exit from all seven of the optical fibers 111, 112, 113, 114, 115, 116 and 117, therefore forming a large combined light beam. When the first shutter module 131 is closed, the first light beams in the first optical fibers 121 are completely blocked. Only the second optical fiber 122 (i.e. the optical fiber 111) can output a second light beam, therefore forming a small combined light beam.

In this example, the plurality of optical fibers 110 can be a fiber bundle. The output of the seven-fiber bundle (e.g. 110) can be connected to an optical metrology module such as a spectroscopic reflectometer or ellipsometer, which images a bundle output plane on a sample 101 on a sample holder 102 (e.g. a wafer chuck or plate) using illumination optics 103 such as a fold mirror 103a and an objective 103b. The input of the bundle (e.g. 110) is connected to a light source 141. However, only one fiber i.e. the second optical fiber 122 goes directly from the light source 141 to the optical metrology module. The first optical fibers 121 are connected to an intermediate shutter module (e.g. 131) which can block the light in one, several, or all of them (a preferred embodiment). The intermediate shutter module (e.g. 131) then reimages fibers' outputs into their new fibers which can now transmit the light (with shutter open) to the optical metrology module. At the metrology module illumination entry point, the plurality of optical fibers 110 can be recombined back into the bundle, which is connected to the illumination entry point. The optical metrology module can further include collection optics 143 to direct output light from the sample 101 to a detector 145. Additionally, the optical apparatus 100 may optionally include a second shutter module 133 coupled to the plurality of optical fibers 110 and function as a main shutter or a main switch. That is, when the second shutter module 133 is closed, no light beam can pass through the plurality of optical fibers 110. When the second shutter module 133 is open, light beams can pass through the plurality of optical fibers 110.

In some embodiments, the detector 145 is a directly coupled spectrometer capable of analyzing multiple wavelengths over a range of approximately 200 nm to 800 nm. The spectrometer acquisition operations can also be synchronized with changes in polarization configuration of the optical apparatus 100, such as a rotating polarizer on the illumination side. Alternatively, the detector 145 may be configured to analyze a single wavelength. Note that the detector 145 may include one or multiple measurement channels (or multiple detectors), including any combinations of an oblique incidence spectroscopic ellipsometer, a close-to-normal (e.g. <20° angle-of-incidence) polarized or unpolarized reflectometer, a pattern recognition imaging camera-based channel for wafer navigation and detection of surface-defects, a channel for measurements of non-specular reflections, and the like. The measurement channels above may have co-located or closely-spaced measurement spots.

Herein, the operation of the fiber bundle-based spot selector (e.g. 110) includes control over at least two shutters. When a small spot is desired, then a main shutter (e.g. 133) at the light source 141 is open, but an intermediate shutter (e.g. 131) blocks the light through the first optical fibers 121, and only the second optical fiber 122 is illuminated, creating a small spot on the sample 101. If a large spot is desired, the intermediate shutter (e.g. 131) is open along with the main shutter (e.g. 133), and a large spot is created.

Figure 5:
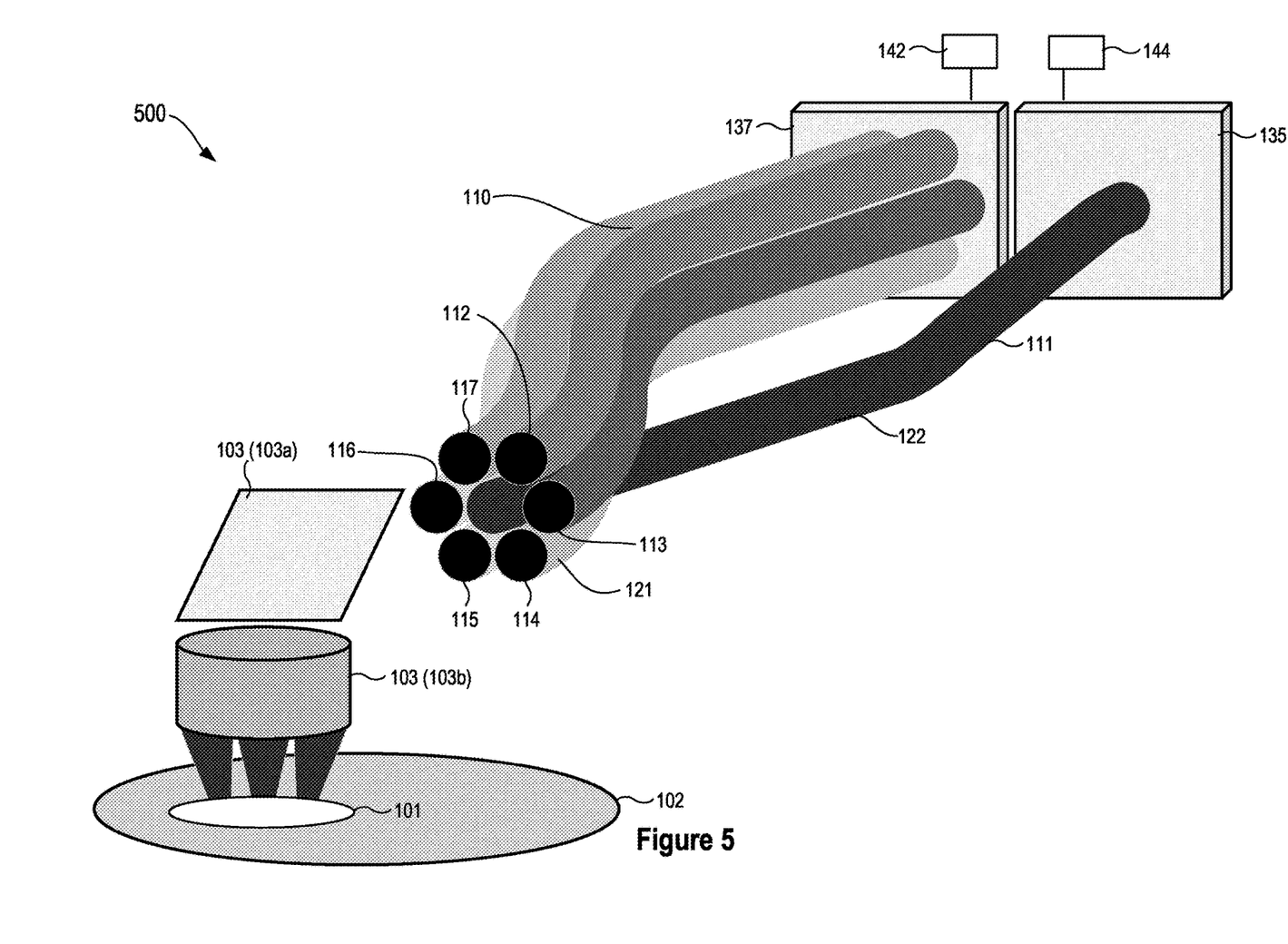
FIG. 5 shows a schematic view of an optical apparatus, in accordance with yet another embodiment of the present disclosure.

In other embodiments, the plurality of optical fibers 110 are bundled at an output end to output the aforementioned combined light beam. However, the plurality of optical fibers 110 may not be bundled at an input end. Accordingly, the plurality of optical fibers 110 may each receive a respective light beam from a respective light source. For example in FIG. 5, an optical apparatus 500 includes the first optical fibers 121 that are coupled to a first shutter module 137 and configured to receive light from a first light source 142. The second optical fiber 122 is coupled to a second shutter module 135 and configured to receive light from a second light source 144. Other optional components (e.g. the collection optics 143, the detector 145, the controller 160 and the like) are omitted herein for simplicity purposes. The first shutter module 137 and the second shutter module 135 can include mechanical light-blocking devices. In one embodiment, the first light source 142 and the second light source 144 are two independent light sources. In another embodiment, the first light source 142 and the second light source 144 can be achieved in the form of one common light source having two outputs.

In other embodiments, other combinations are possible. For example, one may route the optical fibers 112 and 113 through a first intermediate shutter, and the optical fibers 114 and 117 through a second intermediate shutter. Then it's possible to select a medium-sized spot from the optical fibers 111, 112 and 113 by opening the main shutter (e.g. 133) and the first intermediate shutter for the optical fibers 112 and 113, but not the second intermediate shutter for the optical fibers 114 and 117.

Still referring to FIG. 1, it should be understood that not all components described above are necessary for the optical apparatus 100. Depending on specific design needs, the optical apparatus 100 may include some or all of the components described above. For example, the optical apparatus 100 may include the plurality of optical fibers 110 and the first shutter module 131 and function as a standalone fiber bundle, which can be connected to an external light source and integrated into an existing optical metrology tool. In other words, the standalone fiber bundle can replace, at least in part, conventional illumination optics between a light source and a sample.

In some embodiments, the optical apparatus 100 can optionally include a controller 160. Other components of the optical apparatus 100 can be connected to and controlled by the controller 160 that may optionally be connected to a corresponding memory storage unit and user interface (all not shown). Various characterization operations can be executed via the user interface and stored in a storage unit. Accordingly, the sample 101 can be characterized with various optical techniques (e.g. ellipsometry, reflectometry, etc.) and models.

In a non-limiting example, the controller 160 is coupled to at least one component selected from the group consisting of the plurality of optical fibers 110, the first shutter module 131, the second shutter module 133, the light source 141, the sample holder 102, the illumination optics 103, the collection optics 143 and the detector 145. It should be understood that the controller 160 may be coupled to various components of the optical apparatus 100 to receive inputs from and provide outputs to the components. For example, the controller 160 can be configured to receive data from the detector 145. The controller 160 can also be configured to adjust knobs and control settings for the first shutter module 131 and/or the second shutter module 133. The controller 160 can further be configured to adjust knobs and control settings for the light source 141, the detector 145, the sample holder 102, the illumination optics 103 and/or the collection optics 143. Of course the adjustments can be manually made as well.

The controller 160 can be implemented in a wide variety of manners. In one example, the controller 160 is a computer. In another example, the controller 160 includes one or more programmable integrated circuits that are programmed to provide the functionality described herein. For example, one or more processors (e.g. microprocessor, microcontroller, central processing unit, etc.), programmable logic devices (e.g. complex programmable logic device (CPLD)), field programmable gate array (FPGA), etc.), and/or other programmable integrated circuits can be programmed with software or other programming instructions to implement the functionality of a proscribed plasma process recipe. It is further noted that the software or other programming instructions can be stored in one or more non-transitory computer-readable mediums (e.g. memory storage devices, FLASH memory, DRAM memory, reprogrammable storage devices, hard drives, floppy disks, DVDs, CD-ROMs, etc.), and the software or other programming instructions when executed by the programmable integrated circuits cause the programmable integrated circuits to perform the processes, functions, and/or capabilities described herein. Other variations could also be implemented.

Figure 2:
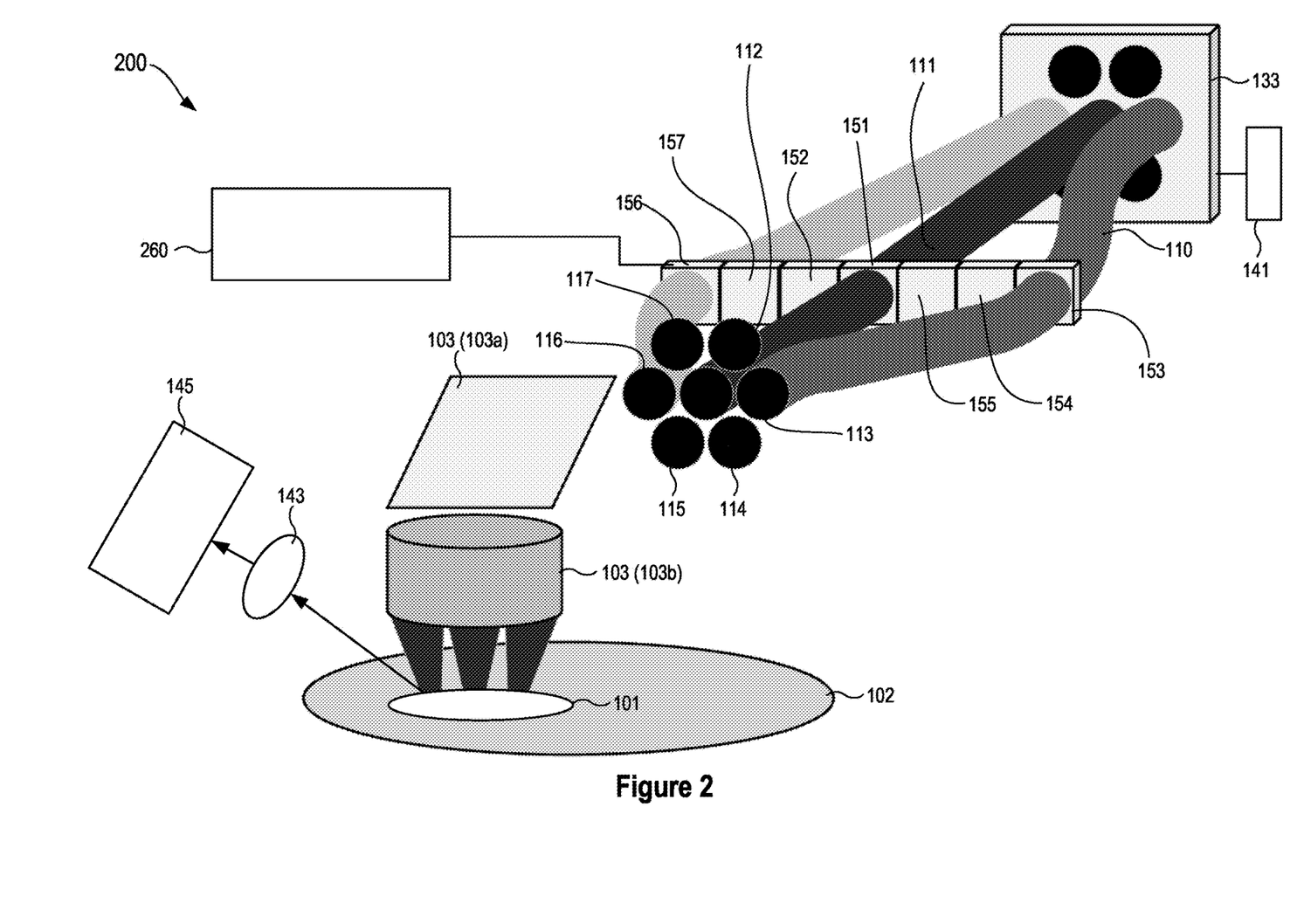
FIG. 2 shows a schematic view of an optical apparatus, in accordance with another embodiment of the present disclosure.

FIG. 2 shows a schematic view of an optical apparatus 200, in accordance with another embodiment of the present disclosure. As illustrated, the optical apparatus 200 includes the plurality of optical fibers 110 including the optical fibers 111, 112, 113, 114, 115, 116 and 117 as well as the second shutter module 133.

Herein, the optical fibers 111, 112, 113, 114, 115, 116 and 117 are each coupled to a respective shutter (or shutter module) 151, 152, 153, 154, 155, 156 and 157, therefore enabling independent and individual control of each optical fiber. For example, selecting the optical fibers 112, 114 and 116 in the bundle can allow for a system configuration with three non-touching optical spots. Note that only the coupling between the optical fibers 111, 113 and 116 and the shutters 151, 153 and 156 are shown, and coupling between other optical fibers and other shutters are omitted from FIG. 2 for illustrative purposes.

The optical apparatus 200 can optionally include a controller 260 which is coupled to one or more of the shutters 151, 152, 153, 154, 155, 156 and 157. The controller 260 is similar to the controller 160. The descriptions have been provided above and will be omitted herein for simplicity purposes. The coupling between the controller 260 and other components (e.g. the light source 141, the second shutter module 133, etc.) shown in FIG. 1 are not shown in FIG. 2 for simplicity purposes.

Referring to FIGS. 1 and 2, it should be understood that the plurality of optical fibers 110 (e.g. in the form of a fiber bundle) may include any number of optical fibers, that is, a larger or smaller number of fibers and not necessarily seven fibers as mentioned above, for example a bundle of nineteen optical fibers consisting of seven as shown in FIG. 1 and another twelve surrounding the seven, or alternatively eighteen fibers surrounding the single central fiber. Other combinations of shutters are also possible, for example no main shutter (e.g. 133) and only individual shutters (e.g. 151, 152, 153, 154, 155, 156 and 157) for each fiber or desired groups of fibers in the bundle (e.g. 110), which may be used to configure an optical metrology or inspection system to operate with an optical spot of a desired shape or multiple non-touching optical spots.

In some embodiments, the first shutter module 131 includes at least one shutter that is a polarization modulator which is configured to modulate polarization of the first light beam(s) when the first shutter module 131 is closed. In some embodiments, the first shutter module 131 includes at least one shutter that is an intensity modulator (e.g. a neutral density filter) which is configured to reduce intensity of the first light beam(s) when the first shutter module 131 is closed.

In some embodiments, the first shutter module 131 includes at least one shutter that is a spectral filter which is configured to filter a spectral portion of a respective first light beam when the first shutter module 131 is closed. In one example, the spectral filter can be an ultraviolet (UV) filter configured to block UV wavelengths of the respective first light beam(s) when the first shutter module 131 is closed, especially for a sample (e.g. photoresist) that might be sensitive to or even damaged by deep ultraviolet (DUV) light. In another example, the spectral filter can be a visible and infrared filter configured to block visible and infrared wavelengths of the respective first light beam(s) when the first shutter module 131 is closed.

In some embodiments, the first shutter module 131 can include at least one shutter selected from the group consisting of a mechanical light-blocking device, a digital micromirror device, an intensity modulator, a polarization modulator and a spectral filter device. The intensity modulator can be, but is not limited to, liquid-crystal-display (LCD)-based. The polarization modulator can be, but is not limited to, LCD-based. The spectral filter device can include, but is not limited to, a dichroic mirror or a Fabry-Perot filter that is mechanically moving or scanning spectral filter. Accordingly, a profile of the combined light beam output by the plurality of optical fibers 110 can be controlled by opening or closing the first shutter module 131.

Note that a "shutter module" (e.g. 133, 135, 137 and 630) and a "shutter" (e.g. 151, 152, 153, 154, 155, 156, 157, 320, 330 and 340) as generally used in the present disclosure can be similar to the first shutter module 131 and a shutter thereof. The descriptions have been provided above and will be omitted herein for simplicity purposes.

In some embodiments, some or all shutters may include spectral filtering and/or modulation capabilities. For example, one may have a configuration with seven fibers in a bundle, a first shutter for the optical fibers 111, 112, 114, 116, and a second shutter for the optical fibers 113, 115, 117. The second shutter may include a filter to block a DUV portion of the illumination spectrum, and the user may have the option to only open the second shutter to measure samples that might be sensitive to or even damaged by DUV (e.g. photoresist).

In another embodiment, one may use multiple individual color filters (e.g. a UV filter, a visible light filter, an infrared light filter, a blue light filter, etc.) to modulate illumination spectral distribution to enhance spectral resolution of e.g. a spectroscopic reflectometer or ellipsometer, or to create hyperspectral illumination source with tunable wavelength selection. In another embodiment, one may use multiple shutters to sequentially measure multiple neighboring locations on sample to e.g. assess sample local uniformity and/or gradient information. For example in FIG. 2, one may close the shutter 151 while keeping other shutters open, then close the shutter 152 while keeping other shutters open, then close the shutter 153 while keeping other shutters open, then close the shutter 154 while keeping other shutters open, then close the shutter 155 while keeping other shutters open, then close the shutter 156 while keeping other shutters open, and then close the shutter 157 while keeping other shutters open. A user may also analyze the measurement results from multiple spots and select one or a linear combination of the outputs to best fit the process needs.

Figure 3:
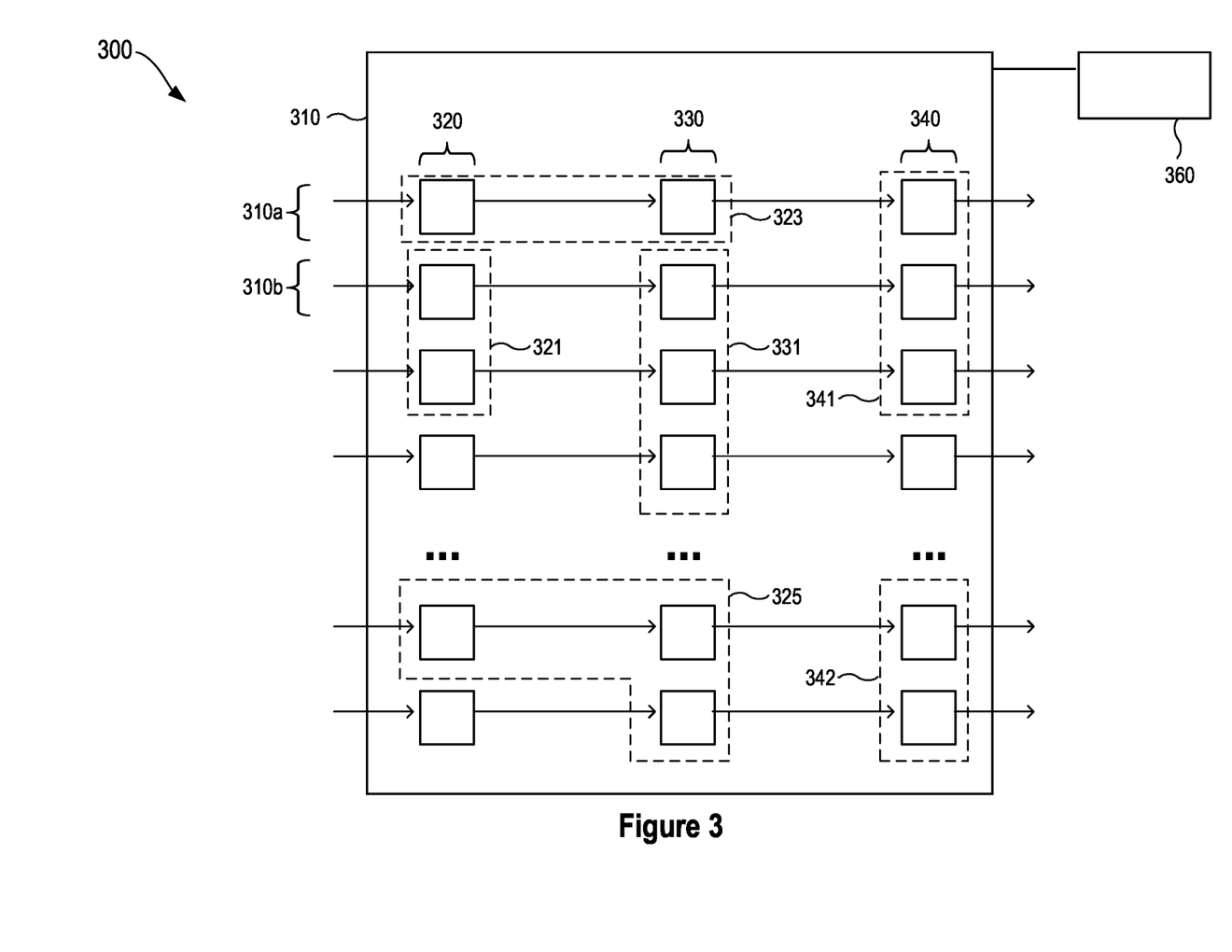
FIG. 3 shows a schematic view of an optical apparatus, in accordance with yet another embodiment of the present disclosure.

In some embodiments, a series of shutters or shutter modules can be coupled to one or more light fibers. Particularly, FIG. 3 shows a schematic view of an optical apparatus 300, in accordance with one embodiment of the present disclosure. The optical apparatus 300 can include a plurality of light fibers 310 having any number of optical fibers (e.g. 310*a*, 310*b*, etc.) arranged in any pattern or array without limitation. Zero, one or more respective shutters (e.g. 320, 330 and 340) or shutter modules can be coupled to each light fiber 310.

In a non-limiting example, each light fiber 310 is coupled to three respective shutters 320, 330 and 340. The three respective shutters 320, 330 and 340 may include at least one intensity modulator, at least one polarization modulator and/or at least one spectral filter, arranged in any sequence or combination. The sequence and/or combination may be different from one light fiber (e.g. 310*a*) to another (e.g. 310*b*), or alternatively be the same. Shutters 320, 330 and 340 may be independent of each other to offer individual control or be grouped into one or more shutter modules (e.g. 321, 323, 325, 331, 341, 342 and the like).

The optical apparatus 300 can further include a controller 360 which is coupled to the plurality of light fibers 310, one or more of the shutters 320, 330 and 340, and/or one or more of the shutter modules 321, 323, 325, 331, 341 and 342. The controller 360 is similar to the controller 160. The descriptions have been provided above and will be omitted herein for simplicity purposes.

Figure 6:
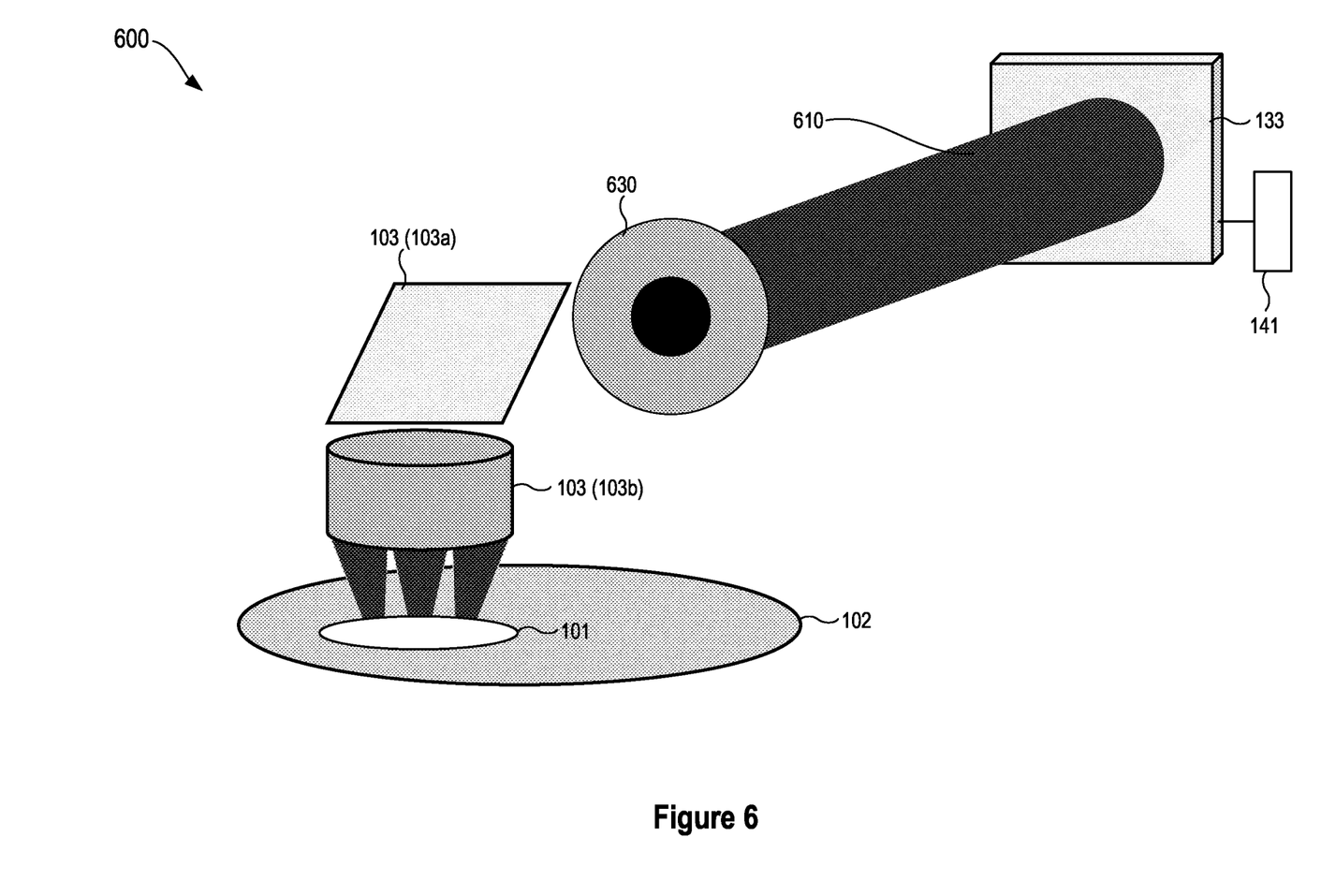
FIG. 6 shows a schematic view of an optical apparatus, in accordance with yet another embodiment of the present disclosure.

In FIG. 6, an optical apparatus 600 includes a light guide 610 and a fifth shutter module 630. Other optional components (e.g. the collection optics 143, the detector 145, the controller 160 and the like) are omitted herein for simplicity purposes. The light guide 610 can include a plurality of optical fibers such as the plurality of optical fibers 110. The light guide 610 can also include a single optical fiber that is relatively large, for instance having a diameter three times of that of the optical fiber 111.

Herein, the fifth shutter module 630 can be configured to have intermediate states between being completely open and being completely closed. That is, the fifth shutter module 630 can be partially closed. As shown, the fifth shutter module 630 can include a variable iris positioned at an output end of the light guide 610. The variable iris and the output end of the light guide 610 may be arranged concentrically. When the fifth shutter module 630 is completely open, a light beam can exit the output end of the light guide 610 with a maximal size. When the fifth shutter module 630 is completely closed, the light beam can be completely blocked. When the fifth shutter module 630 is partially closed, the light beam can partially exit the output end of the light guide 610 with a smaller size than the maximal size. Therefore, a diameter or shape of the light beam can be adjusted depending on the degree to which the fifth shutter module 630 is closed.

Referring to FIGS. 1, 2, 3, 5 and 6, while optical fibers (e.g. 110, 610, etc.) and shutters/shutter modules (e.g. 131, 133, 151-157, 630, etc.) are generally shown to be on the illumination side of an optical path, it should be understood that optical fibers (e.g. 110, 610, etc.) and shutters/shutter modules (e.g. 131, 133, 151-157, 630, etc.) as described herein can be used on the collection side of the optical path as well. For example, the plurality of optical fibers 110 and the first shutter module 131 can replace, at least in part, the collection optics 143 and be used to direct light from the sample 101 to the detector 145. Particularly, the plurality of optical fibers 110 and the first shutter module 131 can be used to send multiple outputs to multiple detectors (e.g. spectrometers). An intermediate device can also be utilized that would block light through desired fibers in the way described in other embodiments, so that the modulation or selection of a spot size, wavelength, or polarization could occur on the collection side.

Additionally, in some embodiments, a light source can have two outputs, and an optical apparatus may include two optical fibers of substantially different diameters. For example, one optical fiber can have a 300 µm core while the other optical fiber can have an 800 µm core. The illumination optics 103 may include a beam splitter or a movable mirror/shutter. Then outputs of those two optical fibers can be combined at the entrance to the measurement module (e.g. at an output end of the two optical fibers) by means of the beam splitter or the movable mirror/shutter.

As can be seen from above, techniques herein provide an apparatus for selecting and adjusting an optical spot size and a shape of an optical metrology or inspection system by using an optical fiber bundle and individual control over propagation of light in individual fibers in the optical fiber bundle.

Figure 4:
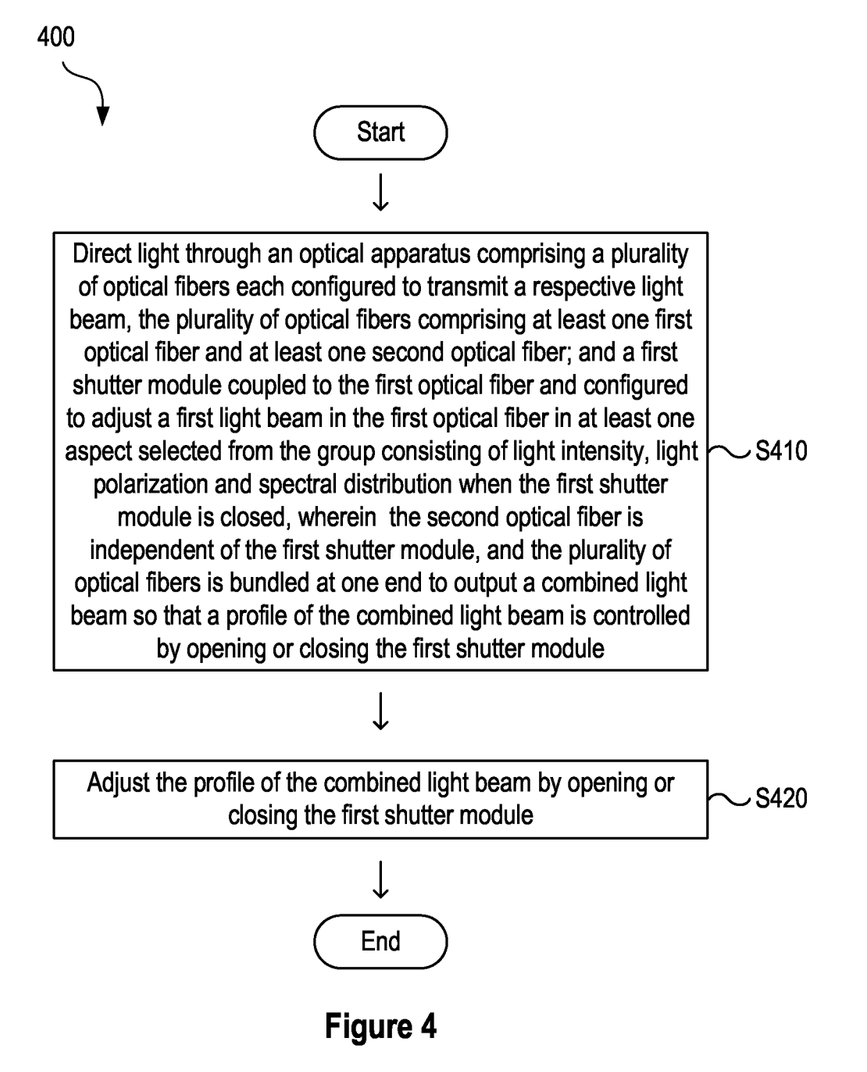
FIG. 4 shows a flow chart of a process for characterizing a wafer, in accordance with some embodiments of the present disclosure.

FIG. 4 shows a flow chart of a process 400 for characterizing a wafer, in accordance with some embodiments of the present disclosure. At Step S410, light is directed through an optical apparatus that includes a plurality of optical fibers each configured to transmit a respective light beam. The plurality of optical fibers includes at least one first optical fiber and at least one second optical fiber. A first shutter module is coupled to the first optical fiber and configured to adjust a first light beam in the first optical fiber in at least one aspect selected from the group consisting of light intensity, light polarization and spectral distribution when the first shutter module is closed. The second optical fiber is independent of the first shutter module, and the plurality of optical fibers is bundled at one end to output a combined light beam so that a profile of the combined light beam is controlled by opening or closing the first shutter module. At Step S420, the profile of the combined light beam is adjusted by opening or closing the first shutter module.

In some embodiments, the first shutter module is configured to let the first light beam pass through the first optical fiber when the first shutter module is open and block the first light beam when the first shutter module is closed. The plurality of optical fibers is bundled at the one end to output the combined light beam so that a size or shape of the combined light beam is controlled by opening or closing the first shutter module. The process 400 further includes adjusting the size or shape of the combined light beam by opening or closing the first shutter module.

In some embodiments, the process 400 further includes directing the combined light beam output by the optical apparatus through optics to a wafer sample on a sample holder. Output light from the sample holder is detected with a detector. The profile of the combined light beam is adjusted by opening or closing the first shutter module.

In some embodiments, the process 400 further includes sequentially measuring neighboring locations of the wafer sample by sequentially and selectively closing a plurality of shutters each independently coupled to a respective optical fiber of the plurality of optical fibers.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

The sample 101 can be a substrate, a wafer or even a bio sample. "Substrate" or "wafer" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

The substrate can be any suitable substrate, such as a silicon (Si) substrate, a germanium (Ge) substrate, a silicon-germanium (SiGe) substrate, and/or a silicon-on-insulator (SOI) substrate. The substrate may include a semiconductor material, for example, a Group IV semiconductor, a Group III-V compound semiconductor, or a Group II-VI oxide semiconductor. The Group IV semiconductor may include Si, Ge, or SiGe. The substrate may be a bulk wafer or an epitaxial layer.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. An optical apparatus, comprising:
a plurality of optical fibers each configured to transmit a respective light beam, the plurality of optical fibers comprising at least one first optical fiber and at least one second optical fiber, the first optical fiber including a first end configured to receive a first light beam and a second end that is opposite to the first end; and
a first shutter module positioned optically between the first end of the first optical fiber and the second end of the first optical fiber and configured to adjust the first light beam in the first optical fiber in at least one aspect selected from the group consisting of light intensity, light polarization and spectral distribution when the first shutter module is closed, wherein
the second optical fiber is independent of the first shutter module, and
the plurality of optical fibers is bundled at the second end of the first optical fiber to output a combined light beam so that a profile of the combined light beam is controlled by opening or closing the first shutter module.

2. The optical apparatus of claim 1, wherein the first shutter module is configured to let the first light beam pass through the first optical fiber when the first shutter module is open and block the first light beam from exiting the second end of the first optical fiber when the first shutter module is closed.

3. The optical apparatus of claim 2, wherein the plurality of optical fibers is bundled at the second end of the first optical fiber to output the combined light beam so that a size or shape of the combined light beam is controlled by opening or closing the first shutter module.

4. The optical apparatus of claim 2, further comprising a second shutter module coupled to the first optical fiber and configured to adjust the first light beam in at least one aspect selected from the group consisting of light polarization and spectral distribution when the second shutter module is closed.

5. The optical apparatus of claim 1, wherein the first shutter module includes a spectral filter that is configured to filter a spectral portion of the first light beam when the first shutter module is closed.

6. The optical apparatus of claim 5, wherein the spectral filter is an ultraviolet (UV) filter configured to block UV wavelengths of the first light beam from exiting the second end of the first optical fiber when the first shutter module is closed.

7. The optical apparatus of claim 1, wherein the first shutter module includes a polarization modulator that is configured to modulate polarization of the first light beam when the first shutter module is closed.

8. The optical apparatus of claim 1, wherein the first shutter module includes at least one shutter selected from the group consisting of a mechanical light-blocking device, a digital micromirror device, an intensity modulator, a polarization modulator and a spectral filter device.

9. The optical apparatus of claim 8, wherein:
the intensity modulator is liquid-crystal-display (LCD)-based,
the polarization modulator is LCD-based, and
the spectral filter device includes a dichroic mirror or a Fabry-Perot filter that is mechanically moving or scanning spectral filter.

10. The optical apparatus of claim 1, further comprising:
a second shutter module coupled to the second optical fiber and configured to adjust a second light beam in the second optical fiber in at least one aspect selected from the group consisting of light intensity, light polarization and spectral distribution when the second shutter module is closed,
wherein the first optical fiber is independent of the second shutter module.

11. The optical apparatus of claim 1, further comprising optics configured to receive the combined light beam from the plurality of optical fibers.

12. The optical apparatus of claim 11, further comprising:
a sample holder configured to receive a wafer sample which receives the combined light beam from the optics; and
a detector configured to detect output light from the sample holder.

13. The optical apparatus of claim 1, further comprising at least one light source configured to emit light for the plurality of optical fibers.

14. The optical apparatus of claim 1, wherein the plurality of optical fibers is bundled at the first end of the first optical fiber to receive light from a common light source.

15. The optical apparatus of claim 1, wherein the plurality of optical fibers is each independently coupled to a respective shutter module.

16. The optical apparatus of claim 1, wherein:
the plurality of optical fibers includes six first optical fibers and a single second optical fiber,
the first shutter module is coupled to the six first optical fibers and configured to let six respective first light beams pass through the six first optical fibers when the first shutter module is open and block the six respective first light beams when the first shutter module is closed, and
the single second optical fiber is coupled to no shutter module.

17. A method of beam profile adjustment, the method comprising:
directing light through the optical apparatus according to claim 1; and
adjusting the profile of the combined light beam by opening or closing the first shutter module.

18. A method of beam size adjustment, the method comprising:
directing light through the optical apparatus according to claim 3; and
adjusting the size or shape of the combined light beam by opening or closing the first shutter module.

19. A method of wafer characterization, the method comprising:
directing light through the optical apparatus according to claim 1;
directing the combined light beam output by the optical apparatus through optics to a wafer sample on a sample holder;
detecting output light from the sample holder with a detector; and
adjusting the profile of the combined light beam by opening or closing the first shutter module.

20. The method of claim 19, further comprising:
sequentially measuring neighboring locations of the wafer sample by sequentially and selectively closing a plurality of shutters each independently coupled to a respective optical fiber of the plurality of optical fibers.

21. The optical apparatus of claim 1, wherein the first shutter module is positioned optically between the first end of the first optical fiber and the second end of the first optical fiber so that the at least one aspect of the first light beam is different between the first end of the first optical fiber and the second end of the first optical fiber.

* * * * *